United States Patent [19]

Wu

[11] Patent Number: 4,876,500

[45] Date of Patent: Oct. 24, 1989

[54] USER CARRIED SENSOR FOR DETECTING DISPLACEMENT RELATIVE TO THE GROUND

[76] Inventor: Chuan-Chueng Wu, No. 15, Lane 41, Ta-Tung Road, Fei-Sha Tsun, Su-Hu Hsiang, Yun-Lin Hsien, Taiwan

[21] Appl. No.: 227,615

[22] Filed: Aug. 3, 1988

[51] Int. Cl.[4] .................. G01R 27/26; G01C 22/00; G01B 7/00
[52] U.S. Cl. ..................... 324/61 R; 324/171; 377/24.2; 235/105; 36/132; 364/561
[58] Field of Search ............ 324/61, 59, 171, 176, 324/178; 377/24, 24.2, 20; 235/105; 36/132, 136; 364/410, 561; 272/DIG. 9

[56] References Cited

U.S. PATENT DOCUMENTS 4,371,945 2/1983 Karr et al. ............... 377/24.2 X
4,571,680 2/1986 Wu ........................ 235/105 X Primary Examiner—Reinhard J. Eisenzopf
Assistant Examiner—Jack B. Harvey
Attorney, Agent, or Firm—Kirschstein, Ottinger, Israel & Schiffmiller

[57] ABSTRACT

A sensor to be activated by the ground for sensing a user's movements includes a conductor that contacts the user's skin or maintains a specific distance relative to the user's skin; an electronic device connected to the conductor and responding to changes of electrical charges carried by the user resulting from his movements, thereby generating corresponding electronic AC signals; a DC to AC converter ot convert said electronic Ac signals into DC voltage signals; and a voltage level changing meter having a voltage range and operative to generate a signal when the DC voltage signals are outside the preset range.

14 Claims, 5 Drawing Sheets

USER CARRIED SENSOR FOR DETECTING DISPLACEMENT RELATIVE TO THE GROUND

FIELD OF THE INVENTION

The present invention relates to a sensor, in particular to a ground-actuated sensor which is capable of sensing, when a user is walking, jogging, running or jumping in accordance with the relative difference of elevation between the user and the ground.

BACKGROUND OF THE INVENTION

Most prior art electronic devices that can compute momentum often use a push-type movement sensor to make the sensor generate a response whenever the user conducts a movement (for instance, walking or running a step, or jumping one time in the rope jumping exercise), and then an electronic calculator computes and records the number of times of the related responses of the sensor.

However, such device must use a push-type sensing switch to sense the changes of the user's movements. In installation, the position to install such a push-type sensing switch is restricted, and the switch will be easily damaged by abrasion and thus fail. Most importantly, the accuracy of the sensing is often incorrect. As this kind of push-type switch must use the push of the user's body weight to make the two contact conductors in said switch mutually contact for generating a responsive signal, if and when the installation position is slightly deviated, or the user's movement is incorrect, wrong responsive signals may be generated. This, in turn, generates incorrect computed results.

SUMMARY OF THE INVENTION

The overall object of the present invemtion is to provide sensor that will very accurately sense changes of the user's movements or actions even without contacting the user's body.

Another object of the present invention is to provide a ground-actuated sensor. Its installation position is not subjected to any limitations and therefore offers more convenience in use.

The sensor in the present invention comprises:
an electronic device, e.g. a transistor having a high value and a base connected to a conductor that is mounted in contact or at a distance from a user's body. the transistor is operative to generate responses by the changes in electrical charges on the user's body, which occur when changes on the contact surface between the user's body and the ground take place or changes on distance between the user's body and the ground take place;
an amplifier that can amplify the AC voltage output signals of said electronic device;
an AC to DC converter that can covert the AC signals into stable DC signals; and
a voltage level changing device) that measures changes of the output of said AC to DC converter when the changes reach a specific extent and is mainly composed of a comparator and will generate an output signal when said device measures a change of said converter that has reached a specific extent.

Since the quantity of charges contained in the user's body may include an AC component coming from a commercial power supply, the magnitude of the quantity of charges correlates to the contact area between the user's body and the ground or the distance between the user and the ground. Therefore, if said contact area or distance varies, the quantity of charges carried by the user's body also varies.

Coincidentally, during movements, most user's body movements will make the contact area or distance between his body and the ground constantly change. For instance, in walking and running, the user must alternately change from "two-feet touching the ground" to "one-foot touching the ground". Therefore, changes in the distance between the user's body and the ground take place. As there are too many examples to cite here, there is no need to elaborate here on this point.

Now if we connect an electronic device, e.g. a high B value transistor to the conductor which is placed either directly in contact with the user's body or maintained at a specific distance from the user's body, when changes in the charges carried by the user's body take place, changes in the voltage at the base and the collector of said transistor also take place. A number of changes may be converted to the user's body momentum. Instead of said high B value transistor, a field-effect transistor (FET) or other types of transistors may be used.

DETAILED DESCRIPTION OF THE PREFERRED EMBODIMENT

Figure 1:
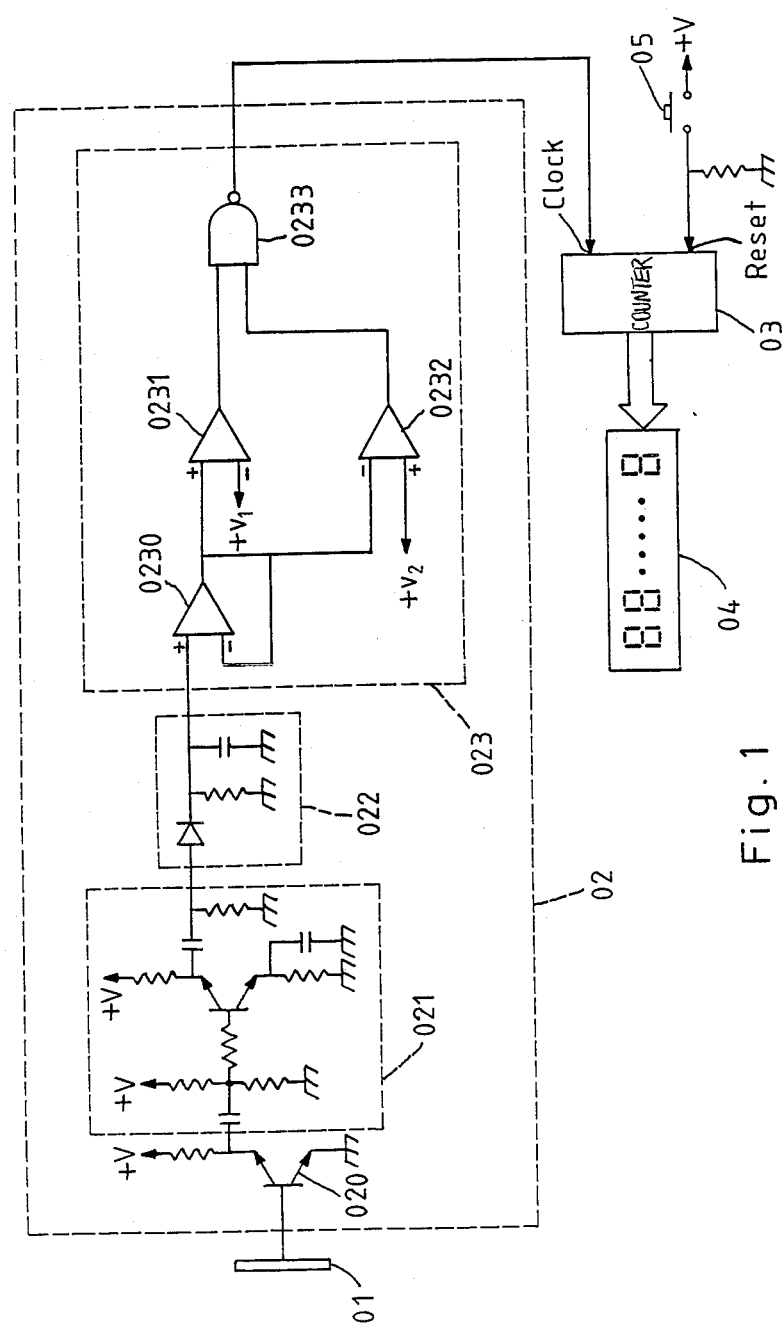
FIG. 1 is an electrical circuit diagram in accordance with the present invention.

Shown in FIG. 1 is the basic current in relation to the present invention. Now, several points are described for further elaboration:

1. In the drawing 01 is a conductor that either directly contacts the user's body or maintains a specific distance relative to the user's body.

2. 02 is a meter to measure changes in the electrical charges carried by the user's body and comprises:
an electronic inductor composed of a high B value transistor 020 and a collector resistor, or an FET, or an amplifier composed of the mentioned elements;
an amplifier 021;
an AC to DC converter 022 that can convert the output of the amplifier 021 into a more stable DC voltage; and
a voltage level changing device 023.

3. The "device" 023 comprises:
a computing amplifier 0230 that can raise the current potential of the DC output of the converter 022;
two computing amplifiers 0231, 0232 that are used as comparators;
when the output of the computing amplifier 0230 goes between V1 and V2 (V1<V2), the output of both the computing amplifiers 0231, 0232 is 1; otherwise, if and when the output of the computing amplifier 0230 is smaller than V1 or larger than V2, the output of the computing amplifier 0231 or 0232 is 0 respectively; and an inverted AND gate 0233 that generates an output only when the output of the computing amplifiers 0231, 0232 is 1.

4. V1 and V2 mentioned above are two reference voltage values. When the contact area or the distance between the user's body and the ground remains unchanged, the output of the DC converter 022 is an approximately fixed DC voltage. Since the induced voltage on the conductor 01 is an alternating, the output of the amplifier 021 must also be an AC voltage at the same frequency. The AC voltage goes through a filter circuit composed of a resistor and a capacitor in the DC converter 022. The output of the converter 022 has a slightly variable DC, and V1 and V2 are the lowest and highest points of said variable DC. Therefore, if the induced voltage on the conductor 01 remains unchanged, the output of the DC converter 022 is between V1 and V2. Otherwise, if the induced voltage is smaller than V1 or larger than V2, this indicates that the induced voltage on the conductor 01 changed, that is, that the contact area or the distance between the user's body and the ground changed.

5. As described above, when a change in the contact area or in the distance between the user's body and the ground takes place one time, the device 0234 will put out a signal 1 (i.e. High).

6. 03 is an electronic counter that computes and records the signal 1 put out by the device 023.

7. 04 is a display of a set of digits or numerals that displays the corresponding numerals for the output of the electronic counter.

8. 05 is a clearing switch of the electronic counter 03. When this or reset switch is depressed, the output for the electronic counter will be cleared to become 0.

Figure 2:
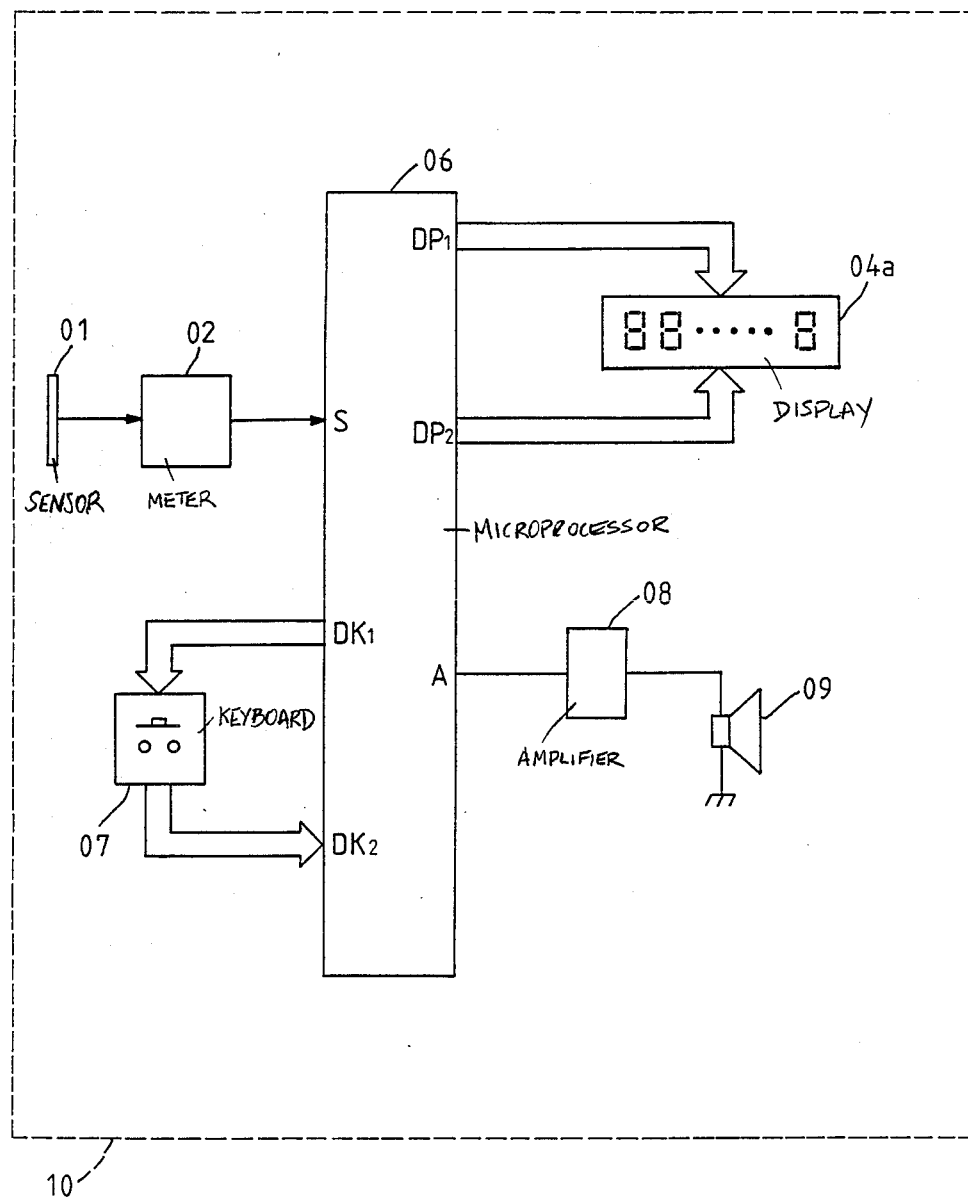
FIG. 2 is a block diagram showing the present invention being used for step counting.

Shown in FIG. 2 is a block diagram of the multi-functional momentum calculator comprising a microprocessor system 06 composed of the conductor 01 and charge-changing meter shown in FIG. 1. Now, several points are further described as follows in this connection:

1. The I/O lines of the microprocessor system 06 include an input line S that reads the number of the output signal 1 of the meter 02;

a set of output lines DP1 for the numeral data of 7 sections of the numeral display 04a;

a set of scanning lines DP2 on the output lines DP1 for the numeral data of the 7 sections of the numeral display 04a to serve the purpose of selecting which one of display sections will be lighted;

a set of input lines DK2 in the scanning lines DK1 to supply scanning data to the keyboard 07 to judge which one of the keys has an input;

an output line A to supply alarm signals to the amplifier 08; and 2. 07 is a keyboard having a set of input keys to conduct the following operations:

(1) to put in the approximate step distance data of each of the steps in walking or running; (2) after conducting the input process in coordination with the above-said entry operation (1), to put in the full distance data of the walking or running the user wants to select for himself; (3) to put in all the time the user wants to take; (4) to put in the data concerning the number of the signal the meter 02 outputs; (5) to put in the data of the user's age and body weight; and (6) to selectively make the display of the numeral display 04a show such data as the number of the output signal 1 of the meter 02, or the instantaneous or average speed of the output signal 1 of the meter, or the total time of all the movements (physical exercise), or the heat volume consumed during the movements, or the total mileage elapsed during walking or running, or the time at the present moment.

3. When the number of the output signal 1 of the meter 02 is larger than or equal to the input data described in the above item 2 (3), or the total time of the movements is larger than or equal to the data put in as described in the above item 2 (3), or the total distance passed through during walking or running is larger than or equal to the data put in as described in the above item 2(2), the output line A will put out the alarming signal for a period of time.

4. 08 is an amplifier; 09 is a minimicrophone.

5. In addition to the functions handled by the microprocessor system 06, its remaining functions include:

(1) in coordination with the data put in as described in the above item ((2)-2(1), to compute the total mileage passed during walking or running and each of the instantaneous and average speeds of the walking or running distance;

(2) to compute each of the instantaneous and average speeds for the signal 1 put out (i.e. the speeds indicating the number of steps in walking or running) for the signal 1 put out by the meter 02;

(3) to compute the total time elapsed from the first signal 1 to any signal 1 put out by the meter 02;

(4) to do the same time-recording work as commonly performed by electronic watches; and (5) to convert the consumed heat volume from the put-in data of the user's age and body weight and the distance taken during walking or running.

6. Since the arrangement of the keys on the keyboard 07 and the design for the programs in the microprocessor system 06 are known in the conventional arts, one skilled in the art can easily know how to design them by complying to the above-cited requirements, and these are not the main point of the invention.

Figure 3:
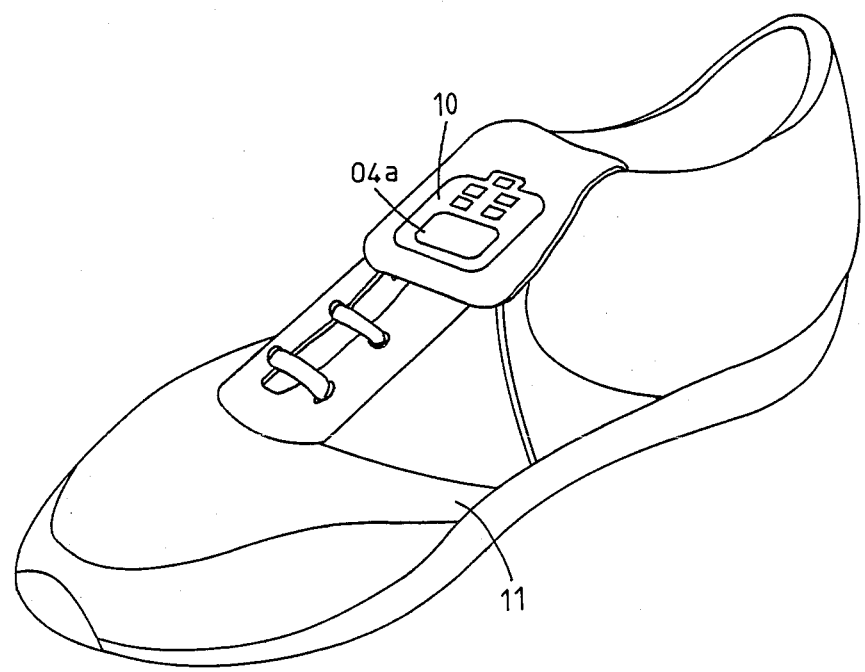
FIG. 3 is a perspective view showing the circuit shown in FIG. 2 mounted on a dial.
Figure 4:
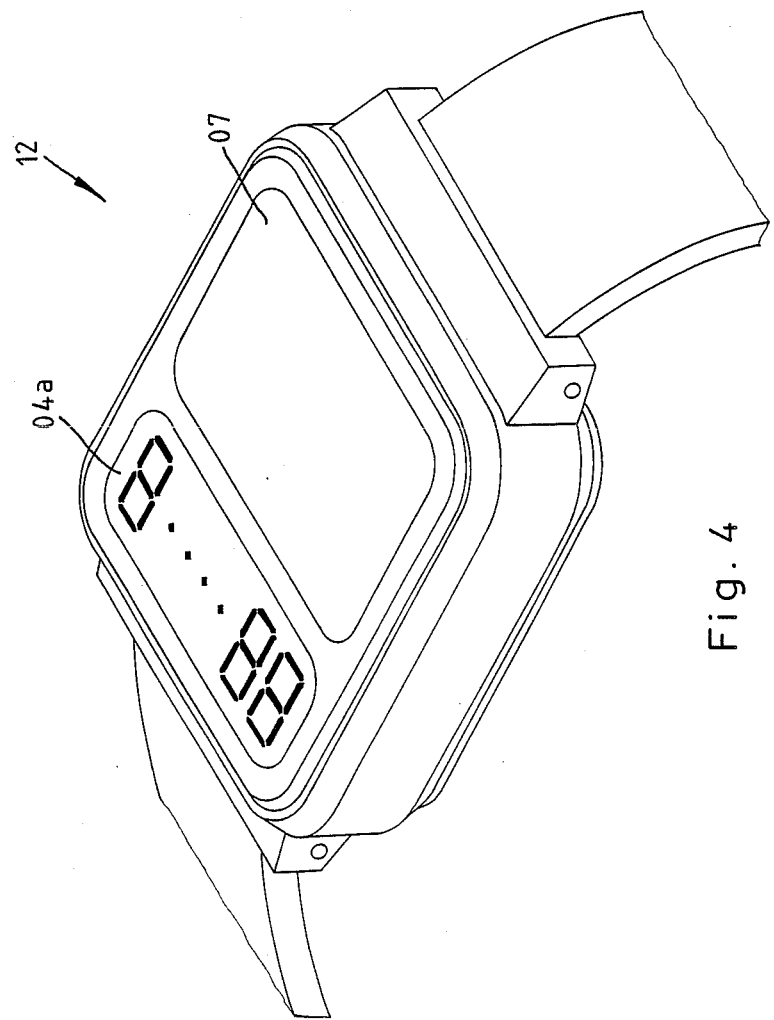
FIG. 4 is a perspective view showing the circuit shown in FIG. 2 installed on a watch case.
Figure 5:
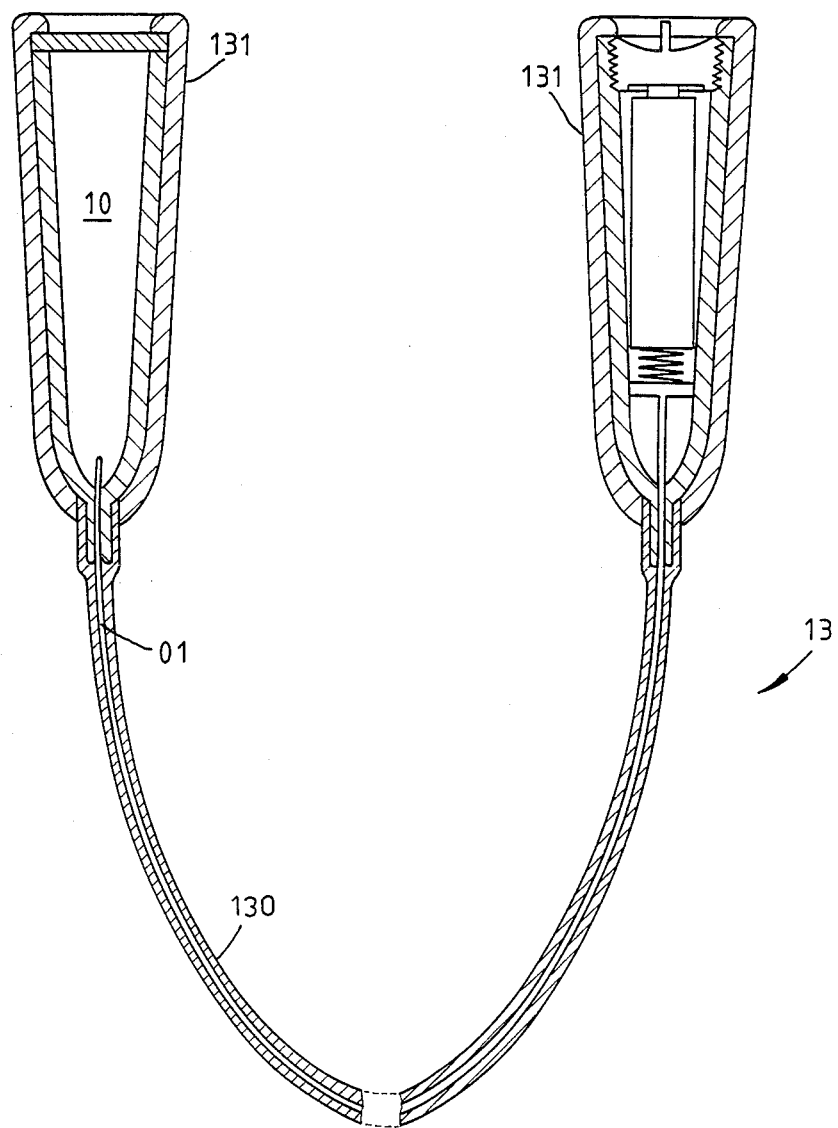
FIG. 5 is a sectional view showing the circuit shown in FIG. 2 installed in the grips of a jumping rope and in the rope.

Shown in FIGS. 3–5 are the exemplary embodiments of the present invention applied to respectively shoes, electronic watch and jumping cord (rope). In the drawings, 11 is the body of the shoe; 12 is the body of the electronic watch, 13 is the body of the jumping rope, 130 is a rope, 131 is a grip of the jumping rope. All the identification numbers in the other drawings are the same to those in the above-said drawings.

I claim:

1. A motion-sensing arrangement, comprising:

(a) sensor means positioned in a predetermined relationship relative to the body of a user performing a movement relative to the ground, said sensor means being operative for sensing changes in the elevation, and in the size of the contact area, between the user and the ground, said sensor means being further operative for generating, in response to said sensing, an electrical signal having a variable voltage amplitude proportional to said changes;

(b) converter means for converting the variable electrical signal into a rectified electrical signal having a component with a generally fixed voltage amplitude; and (c) comparator means operatively connected to the converter means, and operative for generaing an output signal when the generally fixed voltage component falls within a predetermined voltage range.

2. The arrangement as claimed in claim 1, wherein the sensor means is positioned in physical contact with the user's body.

3. The arrangement as claimed in claim 1, wherein the sensor means is maintained at a distance away from the user's body.

4. The arrangement as claimed in claim 1, wherein the sensor means is an electrical conductor operative for picking up electrical charges carried by the user's body.

5. The arrangement as claimed in claim 4, wherein the sensor means includes a detector operatively connected to the conductor for detecting the electrical charges, and for generating the variable electrical signal.

6. The arrangement as claimed in claim 5, wherein the sensor means includes an amplifier operatively connected to the detector, for amplifying the variable electrical signal.

7. The arrangement as claimed in claim 5, wherein the detector is a transistor having a base, an emitter and a collector, and wherein the conductor is connected directly to the base.

8. The arrangement as claimed in claim 1, wherein the comparator means includes a first comparator having one input set to a lower threshold volage, a second comparator having one input set to a higher threshold voltage, and wherein the rectified electrical signal is conducted to the other inputs of the comparators, said comparators having respective outputs connected to a logic gate which generates the output signal only when the fixed voltage component lies between the higher and lower threshold voltages.

9. The arrangement as claimed in claim 1; and further comprising processor means for processing the output signal into data descriptive of the movement being performed by the user.

10. The arrangement as claimed in claim 9, wherein the processor means includes a counter for counting the number of the output signals being generated over a time period, and a display for displaying the number of said output signals.

11. The arrangement as claimed in claim 9, wherein the processor means includes a programmed microprocessor to which the output signal is conducted, a keyboard for entering into the microprocessor data descriptive of the user, a display, and an alarm.

12. The arrangement as claimed in claim 1, wherein the arrangement is mounted on a shoe worn on the foot of the user.

13. The arrangement as claimed in claim 1, wherein the arrangement is mounted on a watch worn on the wrist of the user.

14. The arrangement as claimed in claim 1, wherein the arrangement is mounted on a jump rope during jumping exercise by the user.

* * * * *